United States Patent [19]
Oh

[11] Patent Number: 5,861,638
[45] Date of Patent: *Jan. 19, 1999

[54] INSULATED GATE BIPOLAR TRANSISTOR

[75] Inventor: Kwang-Hoon Oh, Seoul, Rep. of Korea

[73] Assignee: Samsung Electronics Co., Ltd., Suwon, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 760,255

[22] Filed: Dec. 5, 1996

[30] Foreign Application Priority Data

Dec. 5, 1995 [KR] Rep. of Korea ................... 1995 46784

[51] Int. Cl.$^6$ .................................................. H01L 29/74
[52] U.S. Cl. ........................................... 257/133; 257/341
[58] Field of Search .................. 257/133, 139, 257/337, 341

[56] References Cited

FOREIGN PATENT DOCUMENTS 5-283676  10/1993  Japan ..................................... 257/139

*Primary Examiner*—Mark V. Prenty
*Attorney, Agent, or Firm*—Jones & Volentine, L.L.P.

[57] ABSTRACT

An insulated gate bipolar transistor according to the present invention has a first and a second emitter regions. A diffusion region of the first conductive type is formed in the first emitter region of the second conductive type. The second emitter region has a region having a high concentration compared with the remaining portion of the second emitter region. The high concentration region is adjacent to the diffusion region and positioned towards the center of a first conductive type well. In addition, the junction depth of the high concentration region is similar to the diffusion region.

16 Claims, 4 Drawing Sheets

INSULATED GATE BIPOLAR TRANSISTOR

BACKGROUND OF THE INVENTION

A. Field of the Invention

The present invention relates to a power transistor, more particularly, to an insulated gate bipolar transistor (hereinafter referred to as an IGBT), having improved switching characteristic.

B. Description of the Prior Art

Generally, an IGBT is a power semiconductor device for reducing a conduction loss of a conventional power MOSFET (metal-oxide semiconductor field effect transistor) effectively.

Since an IGBT has a MOS gate structure, it is controlled by adjusting voltage applied to the gate, while its output characteristic is similar to that of a bipolar transistor.

FIG. 1 is a cross sectional view of an N channel IGBT.

The N channel IGBT has a combination of a vertical double diffuse MOS (VDMOS) structure and a vertical PNP transistor, which has an N type epitaxial layer on a P type substrate and a double diffuse MOS (DMOS) cell formed thereon.

As shown in the FIG. 1, in a conventional N channel insulated gate bipolar transistor, an N+ type buffer layer 120 is formed on a P+ type semiconductor substrate 110, and an N type epitaxial layer 130 is formed on the buffer layer 120. A P type well 140 is formed in the epitaxial layer 130 and N+ type emitter regions 142 separated for each other are formed in the well 140. The well 140 has both a high density region and a low density region. A gate oxide film 150 is formed on the part of the well 140 and the surface of epitaxial layer 130, and a gate 160 enclosed with a insulating film 170 is formed on the gate oxide film 150. The emitter regions 142 and the well 140 are electrically connected to each other via an emitter electrode 180. A collector electrode 182 is formed on the other surface of the substrate 110.

Generally, the epitaxial layer 130 is thick and has the low density in order to provide a high breakdown voltage feature of the IGBT. When the transistor is turned on, the substrate 110 injects carriers into the epitaxial layer 130.

When a positive voltage over a threshold voltage of the device is applied to the gate 160, an inversion layer is produced near the surface of the P type well 140 under the gate oxide film 150. If the bias between the collector electrode 182 and the emitter electrode 180 is forward, electrons move from the emitter region 142 to the epitaxial layer 130 through the inversion layer.

This electron flow serves as a base current of a PNP bipolar transistor composed of the P+ type substrate 110, the N type epitaxial layer 130 and the P type well 140. At this time, since holes are injected into the epitaxial layer 130 from the substrate 110 through the buffer layer 120, the device is turned on. The holes, excess carriers injected from the substrate 110 into the epitaxial layer 130, cause an electric conductivity of the epitaxial layer 130 to be increased to the high level injection state. When the IGBT is turned on, the holes affect a forward voltage drop to be extremely small.

A part of the excess holes are recombined with electrons entered through the reverse layer in the epitaxial layer 130, and the rest of the excess holes flows into the emitter electrode 180 through the reverse biased junction of the well 140 and the epitaxial layer 130.

On the other hand, the electrons without being recombined with the holes within the epitaxial layer 130 are injected into the substrate 110 to flow into the collector electrode 182.

According to this principle, when the IGBT is turned on, currents due to electrons and due to holes exists simultaneously, and this bipolar output characteristic is superior to that of an unipolar device such as an MOSFET.

On the other hand, in order to turn off the IGBT, the gate 150 is either shorted to the emitter electrode 180 or applied with negative voltage so that the electronic current is limited.

Then, the inversion layer disappears so that electrons cannot move. Therefore, a part of electrons within the epitaxial layer 130 are recombined with holes, and the rest are injected into the substrate 110. After all, the electrons disappears and thus currents is rapidly reduced so much as to the electronic currents.

On the other hand, holes within the epitaxial layer 130 are slowly decreased although they are recombined with electrons, since they are minority carriers. A part of holes flows into the emitter electrode 180 through the well 140 and remains as a tail current component in the case of turning off.

When the IGBT is turned off, the collector current is reduced and the supply voltage bias is applied to both the collector 182 and the emitter 180. Therefore, the voltage applied to the device is rapidly increased.

The increasing voltage applied to the collector 182 and the emitter 180 causes the reverse bias on the junction of the epitaxial layer 130 and the well 140, and a depletion layer produced thereby becomes wider as the bias becomes higher. Accordingly, the excess holes in the epitaxial layer 130 are swept into the emitter electrode 180 by a strong electric field of the depletion layer.

As described above, the switching loss of the IGBT is larger than that of the MOSFET because of a residual current due to the excess holes in switching off. In order to solve this problem, a structure being capable of producing paths for holes when turned off is proposed.

This conventional structure will now be described in detail with reference to the accompanying drawings.

FIG. 2 is the cross sectional view of the conventional semiconductor having a structure having an IGBT unit cell formed in an IGBT section I and an MOS control thyristor (hereinafter referred to as an MCT) unit cell formed in a M section.

As shown FIG. 2, a P+ type substrate 210 has a first surface and a second surface opposite the first surface. An N type epitaxial layer 230 is formed on the first surface of the substrate 210, and a deep P type well 244 and a shallow P type well 240 separated to each other are formed in the epitaxial layer 230 of the MCT section M and the IGBT section I, respectively. A shallow well 240 has a concentration varying from a high density to a low density on going from lower region and to the upper region.

An N+ well 246 is formed in the deep well 244, and P+ diffusion regions 248 separated from each other are formed in the N+ well 246. Emitter regions 242 separated from each other are formed in the shallow well 240. A gate oxide film 250 is formed on the surface of epitaxial layer 230 adjacent to the diffusion region 248 and the N type emitter 242, and the gate 260 covered with the insulating film 270 is formed on the gate oxide film 250. A cathode electrode 280 is formed all over the surface, and an anode electrode 282 is formed on the second surface of the substrate 210.

In this conventional semiconductor device, holes, excess carriers of the epitaxial layer 230, flow into the cathode electrode 280 through the P channel formed in the N+ well 246 of the MCT cell by a negative bias applied to the gate 260 when switching-off.

However, since wells 246 and 240 of different conductive types are formed with the same depth in the MCT section M and the IGBT section I, respectively, an additional masking process is required as well as the IGBT process. Furthermore, since the junction depth of the base region or the deep well 244 of the MCT unit cell should be deeper than the junction depth of the base region or the shallow well 240 of the IGBT unit cell, the epitaxial layer 230 should be thicker than the general epitaxial layer in order to obtain the same breakdown voltage. In this case, there are problems that the resistance under on state increases in turning-off and the switching loss increases due to the increase of the current paths.

In addition, the N channel length of the deep well 244 determined by its junction depth becomes longer than that of the common IGBT. Consequently, the lengthened channel contribute to the increase of the on-resistance. Since the MCT unit cell and the IGBT unit cell are independently arranged, it is difficult to effectively remove the current concentration when switching-off. Accordingly, it is hard to get a large safe operation area (SOA). Moreover, since the high current created by the MCT cell is induced by the latching characteristic of the thyristor, the latching phenomenon is created in the IGBT cell to break the device when switching-off unless the current is dispersed effectively.

SUMMARY OF THE INVENTION

The object of the present invention is to effectively reduce the switching loss due to the excess minority carrier when switching-off.

The insulated gate bipolar transistor according to the present invention has a first and a second emitter regions. A diffusion region of the first conductive type is formed in the first emitter region of the second conductive type.

It is preferable that the second emitter region has a region having a high concentration compared with the remaining portion of the second emitter region. The high concentration region is adjacent to the diffusion region and positioned towards the center of a first conductive type well. In addition, the junction depth of the high concentration region is similar to the diffusion region.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE PREFERRED EMBODIMENT

An IGBT as an embodiment according to this invention will now be described in detail with the reference to the accompanying drawings.

Figure 1:
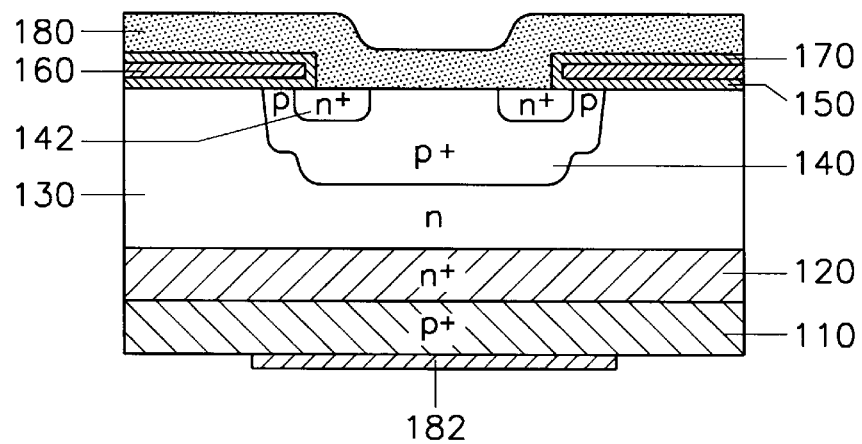
FIG. 1 is a cross sectional view of a conventional N channel insulating gate bipolar transistor.
Figure 2:
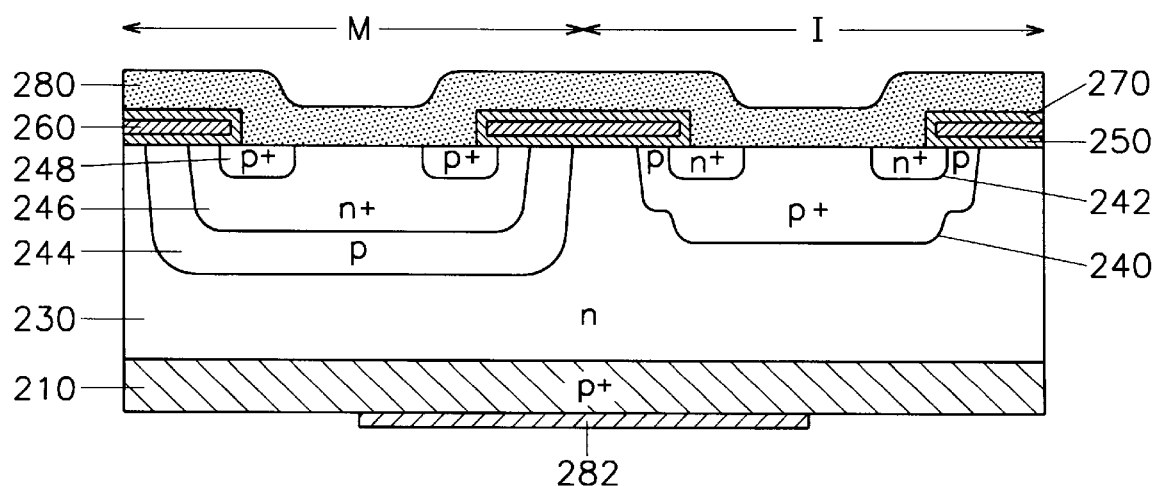
FIG. 2 is a cross sectional view of a conventional semiconductor device composed of the IGBT unit cell and the MCT unit cell.
Figure 3:
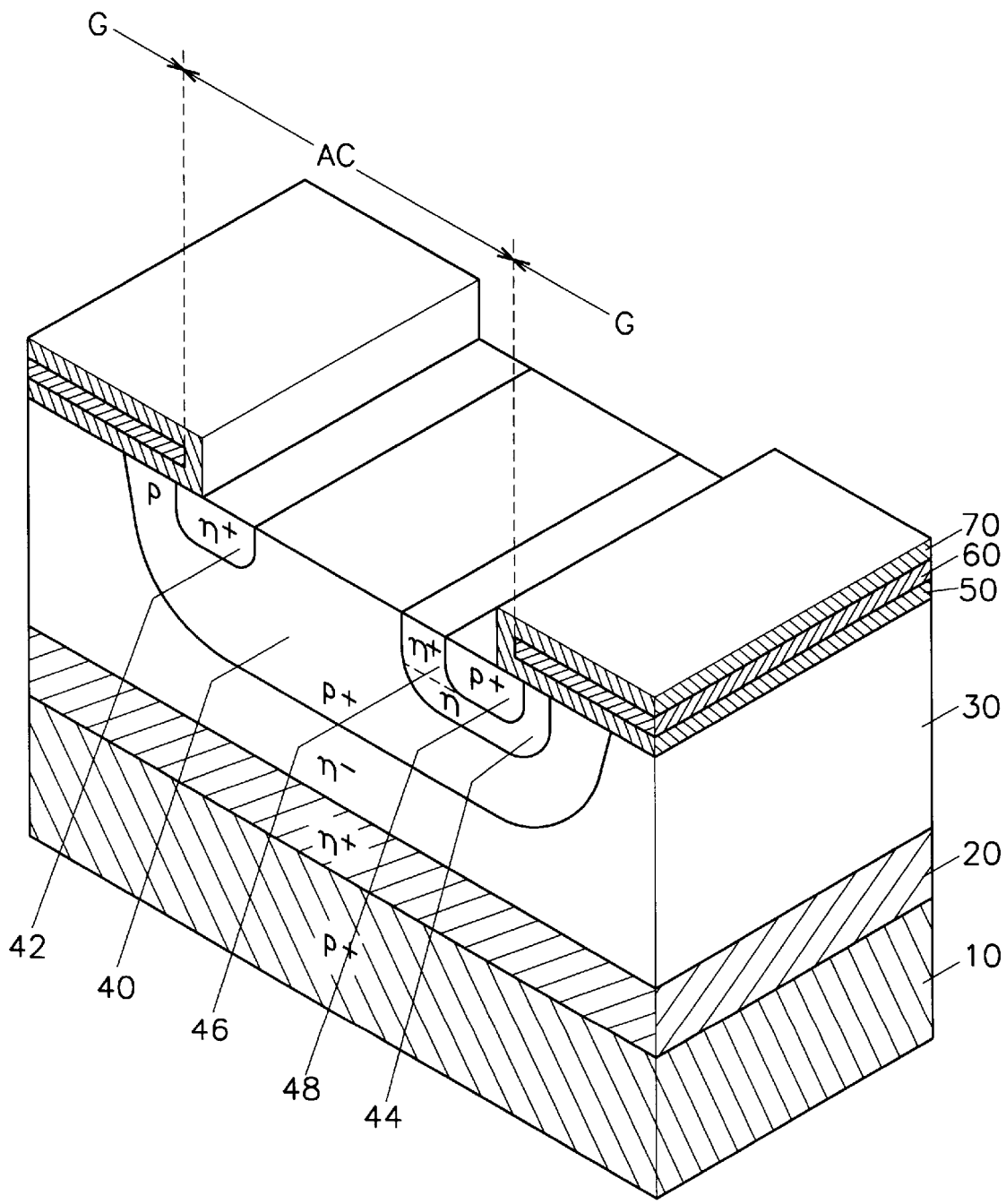
FIG. 3 is a cross sectional view of a structure of an insulated gate bipolar transistor according to an embodiment of the present invention.

FIG. 3 is a cross sectional view of the structure of an IGBT according to an embodiment of the present invention. The IGBT according to this embodiment has basically the same structure of the conventional IGBT. However, it has the modified structure of an N type emitter region in order to improve the switching characteristic, and has a two channel structure.

As shown FIG. 3, a P+ semiconductor substrate 10 has a first surface and a second surface opposite the first surface. An N+ buffer layer 20 is formed on the first surface of the substrate 10, and an N– epitaxial layer 30 is formed on the buffer layer 20. A P+ well 40 is formed in the epitaxial layer 30, and an N type emitter region 42 and an N+ emitter region 44 are separated from each other and formed in the well 40. The N type emitter region 44 is deeper than the N+ emitter region 42, and includes an N+ region 46 at its upper portion. A P+ diffusion region 48 is formed in the N type emitter region 44. A gate oxide film 50 is formed on the surface of the epitaxial layer 30, the N type emitter region 44, and the P+ well 40. The gate oxide film 50 is also formed on the surface of the epitaxial layer 30, the P+ well 40 and the N+ emitter region 42. A gate 60 is formed on the gate oxide film 50, and is covered with the insulating film 70. An emitter electrode (not shown) will be formed on the whole surface, and the collector electrode (not shown) will be formed on the second surface of the substrate 10.

Figure 4:
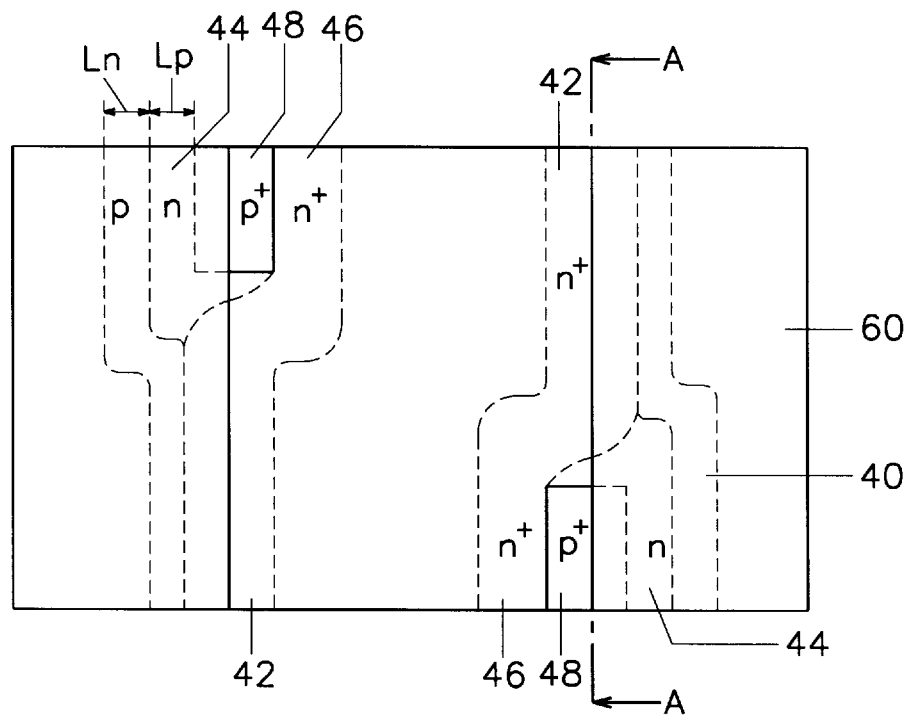
FIG. 4 is a plan view of an insulated gate bipolar transistor according to an embodiment of the present invention.

FIG. 4 is a plan view of an insulated gate bipolar transistor according to an embodiment of the present invention, which has a structure of dot symmetry. If the structure shown in FIG. 3 is rotated by 180 degrees in a horizontal plane and if the front surface of this rotated structure is attached to the rear surface of the structure shown in FIG. 3, then this combined structure corresponds to the structure shown in FIG. 4.

As shown in FIG. 4, the N type emitter region 42 formed in the P+ well 40 of an IGBT is longitudinally extended to form the N+ region 46 of the N type emitter region 44 of another IGBT. Therefore, the junction depths of the N type emitter region 44 and the N+ region 46.

The reference numeral Ln in the FIG. 4 shows the length of the N channel created in on-state, and the reference numeral Lp is the length of the P channel in off-state.

Figure 5:
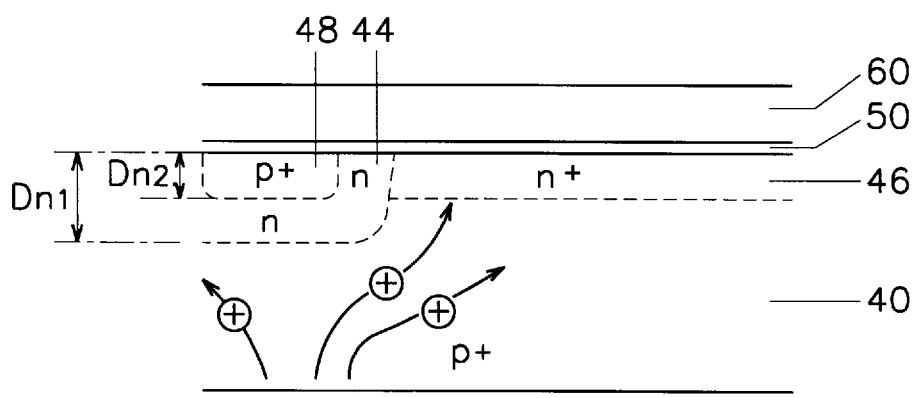
FIG. 5 is a cross sectional view cut along the line A—A in FIG. 4.

As shown FIG. 5, which is a cross sectional view cut along the line A—A shown in FIG. 4, the junction depth Dn1 of the N type emitter region 44 is deeper than the junction depth Dn2 of the N+ emitter region 44 or the N+ region 46. The arrows in FIG. 5 shows the hole current which will be described later.

Figure 6:
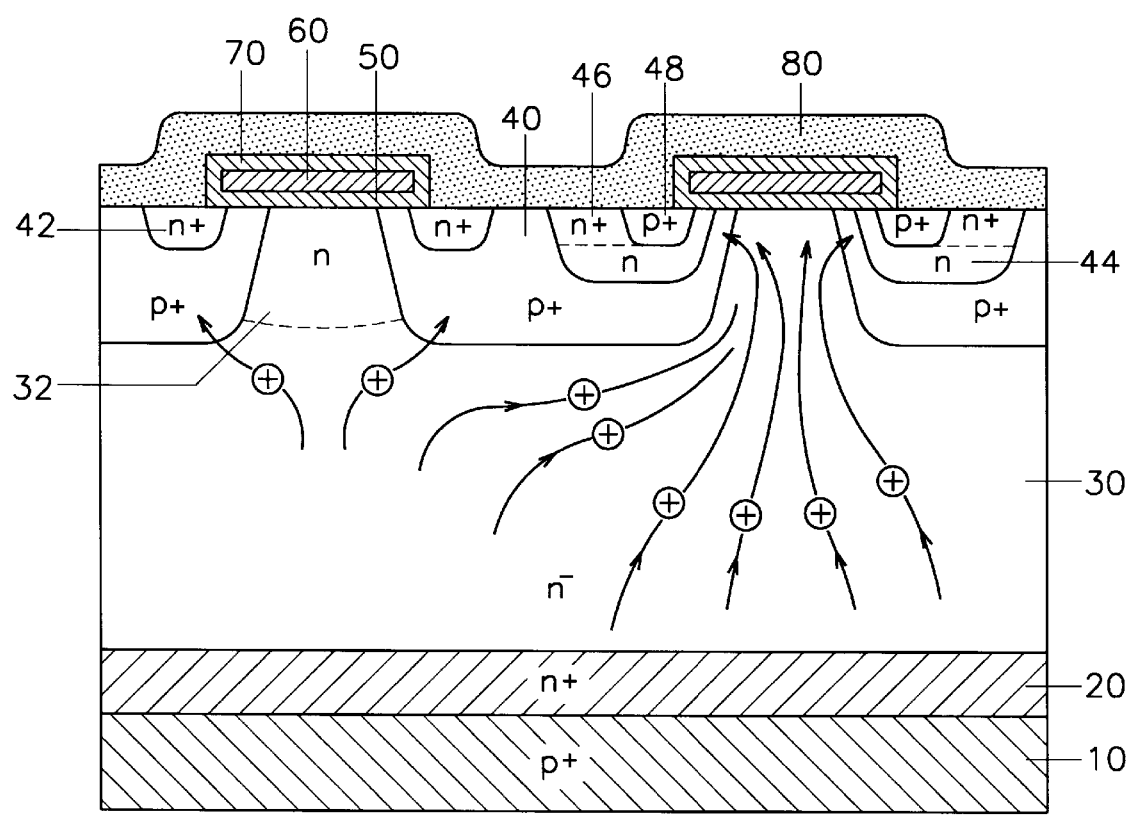
FIG. 6 is a cross sectional view showing the hole current of an IGBT in switching-off state according to an embodiment of the present invention.

FIG. 6 is a cross sectional view of the IGBT according to the embodiment of the present invention.

As shown FIG. 6, a plurality of cells shown in FIG. 3 are arranged in sequence. The structure shown in FIG. 6 is symmetrical with respect to the gate 60. The portion of the epitaxial layer 30 under the gate 60 is called a JFET (junction field emission transistor) region.

Referring to FIGS. 5 and 6, the behavior of the IGBT is described.

In on-state, electrons go around the P+ diffusion region 48 and flows along an N channel (on channel) produced in the P+ well 40. In off-state, holes in the epitaxial layer 30 flows into the emitter electrode along a P channel (off channel) produced in the N type emitter region 44. Since the holes flows along the P channel, lots of holes flow out in a short time and thus the switching time is reduced.

The JFET region between the adjacent N+ emitter regions 42 does not produce off-channel, and thus the JFET region has a region 32 having higher concentration than the other portion. A potential barrier is formed around the region 32 and limits the movements of the holes. Therefore, the holes bypass this region to flow into the off channel so that they easily disappears in off-state.

In addition, since the N region 32 having high concentration reduce the JFET resistance in on-state, a conductivity is improved.

Next, a manufacturing method of the IGBT according to this embodiment is described with reference to FIG. 3.

A buffer layer 20 having a thickness of 5–30 $\mu$m and a concentration of 5E16–2E17/cm is formed on a P+ substrate 10, and an epitaxial layer 30 having a resistance more than 20 ohm is grown on the buffer layer 20 until its thickness becomes more than 40 $\mu$m.

A gate oxide film 50 with the thickness of 600–1,500 Å is grown on the surface of epitaxial layer 30. A polysilicon layer is deposited thereon and patterned to form a gate 60. Since the area of the gate 60 is a primary factor of the current-voltage characteristic of the IGBT, the gate 60 is designed to have a wider area than the conventional IGBT. Otherwise, the JFET area becomes narrow because of an N type emitter region 44 having an N+ region 46 which has both the P channel and the N channel. Thereafter, P type ions are implanted with low concentration not by the self-align method but by the separate masking process. An active P+ well 40 is formed by implanting and diffusing P type ions with a high density. In this time, the channel lengths of in both side portions of the P+ well 40 should be different concerning the off channel. The junction depth of the P+ well 40 is determined by the conductive loss and the breakdown voltage, while it is suitable to be in the range of 4–10 $\mu$m.

An N type emitter region 44 is formed. Its density should be determined concerning the negative bias voltage when switching-off so as to form a sufficient P channel. It is preferable that the junction depth is low as possible within allowable limits in order to improve the IGBT latching characteristic.

P type ions is implanted with a high density into the N type emitter region 44 in which off-channel is formed, and then N type ions is implanted with high concentration. Finally, the N+ region 46 and the P+ diffusion region 48 are formed in the N type emitter region 44 by diffusion process.

In a double channel IGBT manufactured by the abovementioned method, when a bias voltage beyond the threshold voltage is applied to the gate 60 and a forward bias is applied from the collector to the emitter, the electronic current flows through the N channel produced in the P+ well 40 and holes are injected into the N type epitaxial layer 30 from the substrate 10.

Although the size of the emitter regions 42, 44 and 46 are large compared with that of the conventional IGBT, the latch is removed by effectively arranging the off channel. In the N-N type emitter, since the junction depth of the N+ region 46 is shallower than the whole junction depth and the density of the P type ions at the depth is high, the holes move through the short current path under the N+ region 46 in the on-state. Since the N channel near the off channel becomes longer than the other N channel at the other side, the channel resistance is increased and thus the electronic and hole currents are reduced so that the latch is restricted. It is noted that the ratio of the N channel (on channel) against the P channel (off channel) is determined by the ratio of the electronic current against the hole current. Therefore, it is preferable that the ratio of the off channel against the on channel is less than 1 since the gain of the IGBT is smaller than 1.

Accordingly, the IGBT according to this invention maintains the forward bias voltage characteristic of the IGBT and creates the path of the hole current by forming the P channel when switching-off. Accordingly, the holes disappears at a rapid speed when switching off so that the switching characteristic is improved.

The invention thus being described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An insulated gate bipolar transistor comprising:
   a semiconductor substrate of a first conductive type;
   a semiconductor layer of a second conductive type formed on said substrate, said semiconductor layer having a principal surface;
   first and second gate electrodes formed on said principal surface and spaced apart to define a surface region therebetween on said principal surface which is devoid of any other gate electrodes:
   a well of the first conductive type formed in the semiconductor layer below said surface region so as to extend between said first and second gate electrodes;
   a first emitter region of the second conductive type formed in said well;
   a second emitter region of the second conductive type formed in said well and spaced apart from said first emitter region;
   a diffusion region of the first conductive type formed in said second emitter region;
   wherein said first gate is formed on a surface portion of said well located between said first emitter region and said semiconductor layers and on a surface portion of said semiconductor layer located adjacent said first emitter region; and
   wherein said second gate is formed on a surface of said second emitter region, on a surface of said semiconductor layer and on a surface portion of said well located between said second emitter region and said semiconductor layer.

2. The insulated gate bipolar transistor according to claim 1, further comprising a buffer layer of the second conductive type formed between the semiconductor substrate and the semiconductor layer and having a high density compared with the semiconductor layer.

3. The insulating gate bipolar transistor according to claim 2, wherein the thickness of the buffer layer is 5–30 $\mu$m.

4. The insulated gate bipolar transistor according to claim 2, wherein the density of the buffer layer is 5E16–2E17 per unit volume.

5. The insulated gate bipolar transistor according to claim 1, wherein the thickness of the semiconductor layer is more than 40 $\mu$m.

6. The insulated gate bipolar transistor according to claim 5, wherein the resistance of the semiconductor layer is more than 20 ohm.

7. The insulated gate bipolar transistor according to claim 1, wherein the upper portion of the well has lower density compared with the lower portion of the well.

8. The insulated gate bipolar transistor according to claim 1, wherein the junction depth of the second emitter region is deeper than the junction depth of the first emitter region.

9. The insulated gate bipolar transistor according to claim 1, wherein the second emitter region has a high density region having a higher density than the rest region of the second emitter region and formed adjacent to the first conductive type diffusion region.

10. An insulated bipolar transistor comprising:

a semiconductor substrate of a first conductive type;

a semiconductor layer of a second conductive type formed on said semiconductor substrate, said semiconductor layer having a principal surface;

first, second and third wells of a first conductivity type formed in said semiconductor layer, said first and second wells being spaced apart to define a first semiconductor region therebetween of said semiconductor layer, said second and third wells being spaced apart to define a second semiconductor region therebetween of said semiconductor layer, each of said first and second semiconductor regions having a respective principal surface portions;

a first emitter region of said second conductivity type formed in said first well;

second and third emitter regions of said second conductivity type formed in said second well and each of said second and third emitters having second and third junction depths as well as top surfaces respectively;

a fourth emitter region of said second conductivity type formed in said third well and having a fourth junction depth;

first and second diffusion regions of said first conductivity type formed in said third and fourth emitter regions respectively, each of said first and second diffusion regions having top surfaces;

a first gate extending between said first and second emitter regions along surface portions of said first and second wells and said principal portion of said first semiconductor region; and a second gate extending between said first and second diffusion regions along surface portions of said third and fourth emitter regions and said principal surface portion of said second semiconductor region.

11. The insulated bipolar transistor according to claim 10, wherein a portion of said third emitter region which is opposite said second gate electrode relative to said first diffusion region has a higher density than a remaining portion of said third emitter region, and wherein a portion of said fourth emitter region which is opposite said second gate electrode relative to said second diffusion region has a higher density than a remaining portion of said fourth emitter region.

12. The insulated bipolar transistor according to claim 10, wherein said first semiconductor region has a higher density than said second semiconductor region.

13. The insulated bipolar transistor according to claim 10, wherein a buffer layer of said second conductivity type is located between said substrate and said semiconductor layer.

14. The insulated bipolar transistor according to claim 10, wherein a junction depth of each of said first and second emitter regions is shallower than a junction depth of each of said third and fourth emitter regions.

15. An insulated gate bipolar transistor comprising:

a semiconductor substrate of a first conductive type;

a semiconductor layer of a second conductive type formed on said substrate;

a well of the first conductive type formed in said semiconductor layer;

a first emitter region of the second conductive type formed in said well, a second emitter region of said second conductive type formed in said well and separated from said first emitter region;

a diffusion region of the first conductive type formed in said second emitter region;

a first gate formed on the surface of said well between said first emitter region and said semiconductor layer, and on the surface of said semiconductor layer;

a second gate formed on the surface of said second emitter region, one the surface of said semiconductor layer, and on the surface of the well between said second emitter region and said semiconductor layer; and wherein the junction depth of said second emitter region is deeper than the junction depth of said first emitter region.

16. An insulated gate bipolar transistor comprising:

a semiconductor substrate of a first conductive type;

a semiconductor layer of a second conductive type formed on said substrate;

a well of the first conductive type formed in said semiconductor layer;

a first emitter region of said second conductive type formed in said well;

a second emitter region of the second conductive type formed in said well and separated from said first emitter region;

a diffusion region of the first conductive type formed in said second emitter region;

a first gate formed on the surface of said well between said first emitter region and said semiconductor layer and on the surface of said semiconductor layer;

a second gate formed on the surface of said second emitter region, on the surface of said semiconductor layer, and on the surface of said well between said second emitter region and said semiconductor layer; and wherein said second emitter region has a high density region having a higher density than the remaining region of said second emitter region and formed adjacent to said first conductive type diffusion region.

* * * * *